(12) United States Patent
Yeh et al.

(10) Patent No.: US 6,472,736 B1
(45) Date of Patent: Oct. 29, 2002

(54) STACKED STRUCTURE FOR MEMORY CHIPS

(75) Inventors: Nai Hua Yeh; Chen Pin Peng, both of Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/097,822

(22) Filed: Mar. 13, 2002

(51) Int. Cl.$^7$ ............................................. H01L 23/02
(52) U.S. Cl. ...................................................... 257/686
(58) Field of Search ............................... 257/686, 685, 257/723, 777, 781, 784, 693, 678; 438/109, 107, 110

(56) References Cited

U.S. PATENT DOCUMENTS

| | | | |
|---|---|---|---|
| 6,265,766 B1 * | 7/2001 | Moden ........................ | 257/678 |
| 6,265,768 B1 * | 7/2001 | Su et al. ..................... | 257/684 |
| 6,343,019 B1 * | 1/2002 | Jiang et al. ................. | 361/761 |
| 6,218,731 B1 * | 4/2002 | Huang et al. ............... | 257/738 |
| 6,388,313 B1 * | 5/2002 | Lee et al. .................... | 257/686 |

FOREIGN PATENT DOCUMENTS

JP          54-150078          * 11/1979 ................ 257/777

* cited by examiner

Primary Examiner—Jasmine J B Clark
(74) Attorney, Agent, or Firm—Pro-Techtor International Services

(57) ABSTRACT

A stacked structure for memory chips includes a substrate, a lower memory chip, an upper memory chip, and an insulation medium. The substrate has an upper surface, a lower surface and a slot penetrating through the substrate from the upper surface to the lower surface. The lower memory chip has a central portion formed with a plurality of bonding pads. The lower memory chip is arranged on the upper surface of the substrate. The plurality of bonding pads is exposed via the slot of the substrate, and the bonding pads are electrically connected to the lower surface of the substrate via a plurality of wires. The upper memory chip has a central portion formed with a plurality of bonding pads. The upper memory chip is arranged on the lower memory chip in a back-to-back manner with respect to the lower memory chip so that the plurality of bonding pads of the upper memory chip faces upwards. The insulation medium has a central portion formed with a slot. The plurality of bonding pads of the upper memory chip is exposed via the slot of the insulation medium. The insulation medium is formed with a plurality of traces electrically connecting to the bonding pads of the upper memory chip and the upper surface of the substrate via a plurality of wires. Accordingly, the length and radian of each wire can be reduced so that a better signal transmission effect and a smaller package volume can be obtained.

5 Claims, 1 Drawing Sheet

STACKED STRUCTURE FOR MEMORY CHIPS

BACKGROUND OF THE INVENTION

1. Field of the Invention

The invention relates to a stacked structure for memory chips, and more particularly to a stacked structure having high memory capacity and signal transmission speed.

2. Description of the Related Art

In order to increase the memory capacity of a single package body, two or more memory chips are stacked and packaged.

Referring to FIG. 1, a conventional stacked structure for memory chips includes a substrate 10, a lower memory chip 12, and an upper memory chip 14. The substrate 10 has a central portion formed with a slot 16. The lower memory chip 12 is arranged on the substrate 10 and formed with a plurality of bonding pads 18 exposed via the slot 16. The bonding pads 18 are electrically connected to the substrate 10 via a plurality of wires 20. Thus, signals from the lower memory chip 12 can be transmitted to the substrate 10. The upper memory chip 14 is arranged on the lower memory chip 12 in a back-to-back manner with respect to the lower memory chip 12. The upper memory chip 14 also has a central portion formed with bonding pads 22 electrically connected to the substrate 10 via a plurality of wires 24, so that signals can be transmitted to the substrate 10.

In the above-mentioned stacked structure for memory chips, the bonding pads of the memory chips are formed on the central portions. Therefore, when the upper memory chip 14 are electrically connected to the substrate 10 via the plurality of wires 24, the radian of each wire 24 is greater. Accordingly, the length of each wire 24 is longer, the signal transmission is not easy, and the volume of the package body is larger. In this case, the package cannot be made light, thin, short, and small. Furthermore, since the length of each wire 24 is longer, the wires 24 are liable to falling down to contact the surface of the upper memory chip 14, and the condition of bad signal transmission effect or short-circuit may easily occur.

In view of the above-mentioned problems, it is therefore an object of the invention to provide a stacked structure for memory chips capable of overcoming the disadvantages of the conventional structure for memory chips.

SUMMARY OF THE INVENTION

It is therefore an object of the invention to provide a stacked structure for memory chips capable of shortening the signal transmission distance and improving the signal transmission effect.

Another object of the invention is to provide a stacked structure for memory chips capable of enhancing the stacked quality and yield.

Still another object of the invention is to provide a stacked structure for memory chips, which is easily made and more utility.

Yet still another object of the invention is to provide a stacked structure for memory chips capable of reducing the package volume, which is light, thin, short, and small.

To achieve the above-mentioned objects, a stacked structure for memory chips is provided. The structure includes a substrate, a lower memory chip, an upper memory chip, and an insulation medium. The substrate has an upper surface, a lower surface and a slot penetrating through the substrate from the upper surface to the lower surface. The lower memory chip has a central portion formed with a plurality of bonding pads. The lower memory chip is arranged on the upper surface of the substrate. The plurality of bonding pads is exposed via the slot of the substrate, and the bonding pads are electrically connected to the lower surface of the substrate via a plurality of wires. The upper memory chip has a central portion formed with a plurality of bonding pads. The upper memory chip is arranged on the lower memory chip in a back-to-back manner with respect to the lower memory chip so that the plurality of bonding pads of the upper memory chip faces upwards. The insulation medium has a central portion formed with a slot. The plurality of bonding pads of the upper memory chip is exposed via the slot of the insulation medium. The insulation medium is formed with a plurality of traces electrically connecting to the bonding pads of the upper memory chip and the upper surface of the substrate via a plurality of wires.

Accordingly, the length and radian of each wire can be reduced so that a better signal transmission effect and a smaller package volume can be obtained.

DETAIL DESCRIPTION OF THE INVENTION

Figure 1:
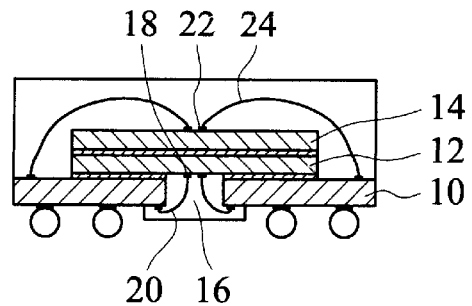
FIG. 1 is a schematic illustration showing a conventional stacked structure for memory chips.
Figure 2:
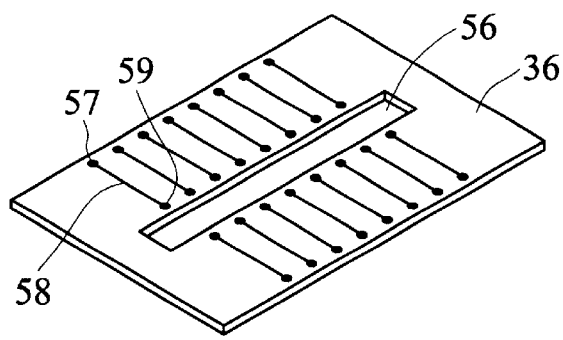
FIG. 2 is a pictorial view showing an insulation medium of the invention.
Figure 3:
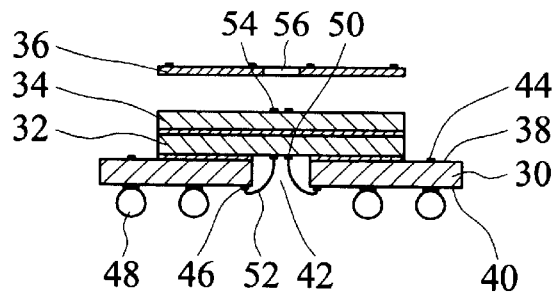
FIG. 3 is an exploded view of the invention.
Figure 4:
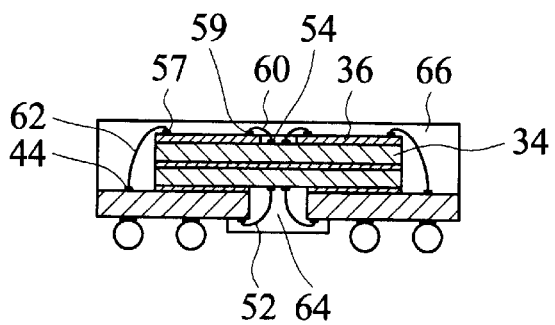
FIG. 4 is a schematic illustration of the invention.

Referring to FIGS. 2 to 4, the stacked structure for memory chips of this embodiment includes a substrate 30, a lower memory chip 32, an upper memory chip 34 and an insulation medium 36.

The substrate 30 has an upper surface 38, a lower surface 40, and a slot 42 penetrating though the substrate 30 from the upper surface 38 to the lower surface 40. The upper surface 38 of the substrate 30 is formed with a plurality of first connection points 44, while the lower surface 40 is formed with second connection points 46 and a plurality of BGA metallic balls 48 at the periphery of the slot 42.

The lower memory chip 32 has a central portion formed with a plurality of bonding pads 50 and is arranged on the upper surface 38 of the substrate 30. The bonding pads 50 are exposed via the slot 42 of the substrate 30. A plurality of wires 52 penetrating through the slot 42 is provided for electrically connecting the bonding pads 50 to the second connection points 46 of the substrate 30, respectively.

The upper memory chip 34 has a central portion formed with a plurality of bonding pads 54 and is arranged on the lower memory chip 32 in a back-to-back manner with respect to the lower memory chip 32. Accordingly, the bonding pads 54 can face up.

The insulation medium 36 may be a flexible circuit board in this embodiment and has a central portion formed with a slot 56. A plurality of traces 58 is formed on the insulation medium 36. Each trace 58 includes two ends (first and second ends) formed with bonding pads 57 and 59. The insulation medium 36 is arranged on the upper memory chip 34 so that the bonding pads 54 on the upper memory chip 34 can be exposed via the slot 56.

Referring to FIG. 4, after the insulation medium 36 is arranged on the upper memory chip 34, a plurality of wires 60 penetrating through the slot 56 is provided for electrically connecting the bonding pads 54 of the upper memory chip 34 to the bonding pads 59 at first ends of the traces of the insulation medium 36. In addition, a plurality of wires 62 is provided for electrically connecting the first connection points 44 of the substrate 30 to the bonding pads 57 at second ends of the traces of the insulation medium 36. Accordingly, the upper memory chip 34 can be electrically connected to the substrate 30. Then, the slot 42 of the substrate 30 is filled with a first encapsulant 64 to protect the plurality of wires 52. In addition, a second encapsulant 66 is provided to cover the upper surface 38 of the substrate 30 so as to protect the upper and lower semiconductor chips 34 and 36 as well as the insulation medium 36.

The above-mentioned structure of the invention has the following advantages.

1. The traces 58 on the insulation medium 36 may be formed with larger diameters so that the signal transmission efficiency and quality can be improved.

2. Since the radian of each of the wires 60 and 62 connecting the upper memory chip 34 to the substrate 30 is smaller, the signal transmission distance can be correspondingly shortened and the overall package volume can be reduced. Thus, the package can be made light, thin, short, and small.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A stacked structure for memory chips, comprising:
   a substrate having an upper surface, a lower surface and a slot penetrating through the substrate from the upper surface to the lower surface;
   a lower memory chip having a central portion formed with a plurality of bonding pads, the lower memory chip being arranged on the upper surface of the substrate, the plurality of bonding pads being exposed via the slot of the substrate, and the bonding pads being electrically connected to the lower surface of the substrate via a plurality of wires;
   an upper memory chip having a central portion formed with a plurality of bonding pads, the upper memory chip being arranged on the lower memory chip in a back-to-back manner with respect to the lower memory chip so that the plurality of bonding pads of the upper memory chip faces upwards; and
   an insulation medium having a central portion formed with a slot, the plurality of bonding pads of the upper memory chip being exposed via the slot of the insulation medium, the insulation medium being formed with a plurality of traces electrically connecting to the bonding pads of the upper memory chip and the upper surface of the substrate via a plurality of wires.

2. The stacked structure for memory chips according to claim 1, wherein the slot of the substrate is filled with a first encapsulant for protecting the plurality of wires.

3. The stacked structure for memory chips according to claim 1, wherein the upper surface of the substrate is covered with a second encapsulant for protecting the upper and lower memory chips and the insulation medium.

4. The stacked structure for memory chips according to claim 1, wherein the insulation medium is a flexible circuit board formed with the plurality of traces.

5. The stacked structure for memory chips according to claim 1, wherein the lower surface of the substrate is formed with BGA (Ball Grid Array) metallic balls.

* * * * *